US 6,597,024 B2

(12) United States Patent
Peek et al.

(10) Patent No.: US 6,597,024 B2
(45) Date of Patent: Jul. 22, 2003

(54) CHARGE-COUPLED IMAGE SENSOR COMPRISING GATE ELECTRODES INTERCONNECTED BY SHUNT ELECTRODES

(75) Inventors: Hermanus Leonardus Peek, Eindhoven (NL); Joris Pieter Valentijn Maas, Eindhoven (NL); Daniel Wihelmus Elisabeth Verbugt, Eindhoven (NL)

(73) Assignee: Dalsa Corporation, Ontario (CA)

( * ) Notice: Subject to any disclaimer, the term of this patent is extended or adjusted under 35 U.S.C. 154(b) by 0 days.

(21) Appl. No.: 09/969,098

(22) Filed: Oct. 2, 2001

(65) Prior Publication Data

US 2002/0063786 A1 May 30, 2002

(30) Foreign Application Priority Data

Oct. 4, 2000 (EP) .............................. 00203460

(51) Int. Cl.[7] ...................... H01L 27/148; H01L 29/768
(52) U.S. Cl. ...................... 257/249; 257/241; 257/243; 257/250
(58) Field of Search ................................ 257/241, 243, 257/249, 250

(56) References Cited

U.S. PATENT DOCUMENTS 4,652,339 A * 3/1987 Bluzer et al. ............... 438/587
6,114,718 A * 9/2000 Hokari et al. ............... 257/250
6,252,265 B1 * 6/2001 Hatano et al. ............... 257/250

FOREIGN PATENT DOCUMENTS

WO 9811608 A1 3/1998

OTHER PUBLICATIONS

"A Low Dark Current Double Membrane Poly–Si FT–Technology for 2/3 Inch 6M Pixel CCD Imagers", by Herman L. Peek et al., IEDM 99, pp. 871–874.

* cited by examiner

Primary Examiner—Ngân V. Ngô
(74) Attorney, Agent, or Firm—Dorsey & Whitney LLP

(57) ABSTRACT

A charge coupled device has a hydrogen diffusion path to diffuse hydrogen to a silicon surface. The hydrogen diffusion path extends through a top silicon oxide layer that itself extends through a first aperture in a top silicon nitride layer. The first aperture overlays a conductor formed of polycrystalline silicon at a location that transversely overlays a channel stop. The hydrogen diffusion path extends through the conductor and through an extension of the conductor that itself extends through a second aperture in a lower silicon nitride layer. The lower silicon nitride layer being one part of a gate dielectric film. The gate dielectric film also includes a lower silicon oxide layer disposed between the lower silicon nitride layer and the silicon surface. The hydrogen diffusion path extends through the lower silicon oxide layer to reach the silicon surface.

12 Claims, 6 Drawing Sheets

CHARGE-COUPLED IMAGE SENSOR COMPRISING GATE ELECTRODES INTERCONNECTED BY SHUNT ELECTRODES

BACKGROUND OF THE INVENTION

1. Field of Invention

The invention relates to charge coupled image sensor devices, and in particular, the invention relates to a new hydrogen diffusion path through such a device to a silicon surface to passivate surface states on the silicon surface.

2. Description of Related Art

The invention relates to a charge-coupled image sensor comprising a silicon body with a surface, parallel channel regions, formed in said body, and channel stop regions mutually separating these regions being adjacent to said surface, which surface is provided with a gate dielectric composed of a layer of silicon oxide covered with a layer of silicon nitride on which gate electrodes of polycrystalline silicon are formed so as to extend transversely to the channel regions and channel stop regions, at least a number of said gate electrodes being provided with a top layer of silicon nitride and extending into diffusion windows, at the location where said gate electrodes cross channel stop regions, which diffusion windows are formed in the layer of silicon nitride of the gate dielectric, an insulation layer of silicon oxide being provided on all gate electrodes, and, on top of said insulation layer, shunt electrodes of polycrystalline silicon situated above the channel stop regions being formed extending in a pattern of contact windows formed in the insulation layer, within which gate electrodes are exposed.

Such an image sensor, which can be used to record television images or digital photographs, comprises, in practice, several million picture elements. Each picture element is formed by a part of a channel region extending below a number, generally four, juxtaposed gate electrodes. Said gate electrodes are clustered in groups of four juxtaposed electrodes G1, G2, G3 and G4, the gate electrodes G1 of these groups being connected to each other as are the gate electrodes G2, G3 and G4. During recording an image, the voltages applied to the gate electrodes are such that charge is stored in the picture elements. The charge packets thus collected are transported through the channel regions to a read-out register integrated on the silicon body by successively applying suitable clock pulses to the gate electrodes. The thin, narrow polycrystalline gate electrodes are comparatively long, as a result of which their electrical resistance is comparatively high. For this reason, polycrystalline silicon shunt electrodes extending transversely to the gate electrodes are applied. Said shunt electrodes contact the gate electrodes in accordance with a pattern. Said shunt electrodes are also clustered in groups of four juxtaposed electrodes S1, S2, S3 and S4. The shunt electrodes S1, S2, S3 and S4 are then connected to, respectively, the gate electrodes G1, G2, G3 and G4. To reduce the resistance of the shunt electrodes, said shunt electrodes may be provided with a top layer composed of a layer of titanium, a layer of titanium nitride and a layer of tungsten.

H. L. Peek et al. disclose in "A Low Current Double Membrane Poly-Si FT Technology for CCD Imagers", IEDM Techn. Digest, p. 871, 1999, particularly in FIG. 5 and the associated description, an image sensor of the type described in the opening paragraph, wherein the gate electrodes are formed in two layers of polycrystalline silicon. A number of gate electrodes, forming a first system of gate electrodes, is formed in a first layer of polycrystalline silicon. This first system is provided with a top layer of silicon nitride. Subsequently, a second system of gate electrodes is formed, between these gate electrodes, in a second layer of polycrystalline silicon. This system is not provided with a top layer of silicon nitride. The gate electrodes of the first system extend into diffusion windows formed in the silicon nitride layer of the gate dielectric at locations where the gate electrodes cross the channel stop regions. A continuous layer of silicon nitride is situated below the gate electrodes of the second system. Said diffusion windows are provided to enable passivation of surface states between the silicon body and the gate dielectric by means of a thermal treatment in hydrogen. In such a thermal treatment, hydrogen readily diffuses through polycrystalline silicon and through silicon oxide, whereas silicon nitride is impermeable to hydrogen. However, hydrogen is capable of penetrating the layer of silicon oxide of the gate dielectric and hence reach said surface states through the diffusion windows provided in the silicon nitride layer that is impermeable to hydrogen.

The above-mentioned article shows that such a passivation of surface states does not always yield the desired results. It has been found that this is caused by the fact that hydrogen cannot always reach the gate electrodes of the first system below which the diffusion windows are formed. In the polycrystalline silicon, the diffusion of hydrogen takes place along grain boundaries. In the comparatively thin, comparatively lightly doped gate electrodes, there are enough grain boundaries to enable diffusion of hydrogen through the diffusion windows in the silicon oxide layer of the gate dielectric. During forming the comparatively thick and comparatively heavily doped shunt electrodes, large silicon crystals can be formed in the contact windows. In the contact windows etched through the silicon nitride top layer of the first system of gate electrodes, said large silicon crystals can close the opening in the top layer of silicon nitride. As a result thereof, there are no grain boundaries inside the opening in the silicon nitride top layer, so that the transport of hydrogen is blocked. During operation of the sensor, diamond-shaped image errors occur. To preclude said image errors, it is proposed to remove the silicon nitride top layer from the first system of gate electrodes before depositing the layer of silicon oxide.

A drawback of this measure resides in that the light sensitivity of this sensor is smaller than that of a sensor whose silicon nitride top layer has not been removed. The silicon nitride layer below the silicon oxide layer can counteract the reflection of light, enabling the light sensitivity to be increased by maximally 20%.

SUMMARY OF INVENTION

It is an object of the invention, inter alia, to provide a sensor wherein said drawback is precluded.

To achieve this, the image sensor mentioned in the opening paragraph is characterized in accordance with the invention in that windows are formed in the silicon nitride top layer present on a number of gate electrodes, which windows are in line with the diffusion windows in the silicon nitride layer of the gate dielectric, a number of said windows forming part of contact windows wherein the shunt electrodes of polycrystalline silicon extend, while the other windows are filled with the silicon oxide of the insulation layer.

The windows forming part of the contact windows wherein the shunt electrodes of polycrystalline silicon extend can be closed to hydrogen transport by silicon crystals. The other windows are filled with silicon oxide of the insulation layer and will remain "open" to hydrogen. Hydrogen can reach the gate electrode through the silicon oxide in these "open" windows and subsequently the layer of silicon oxide of the gate dielectric through the subjacent diffusion windows. The "open" windows are arranged above the channel stop regions and hence between the actual picture elements. Surprisingly, it has been found that the provision, between the picture elements, of comparatively small "open" windows in the silicon nitride top layer enables said diamond-shaped image errors to be precluded without adversely affecting the light sensitivity of the image sensor.

An even greater light sensitivity is obtained if, apart from the gate electrodes extending into said diffusion windows, other gate electrodes are present on the gate dielectric which are also provided with a silicon nitride top layer.

From a technological point of view, it is advantageous if windows are also formed in the top layer of silicon nitride present on the other gate electrodes at the location where they cross channel stop regions. These windows are formed before the insulation layer of silicon oxide is deposited. This measure enables all contact holes to all gate electrodes to be formed in one process step. The contact holes are all formed by etching in silicon oxide, so that etching in silicon oxide and silicon nitride to form some contact holes, and etching in silicon oxide only to form others, is no longer required.

In a simple, very light-sensitive image sensor, the gate electrodes are formed by juxtaposed, equally thick strips of polycrystalline silicon which are provided, at the upper side, with a top layer of silicon nitride and, at the side faces, with a layer of silicon oxide formed by thermal oxidation of polycrystalline silicon. The gate electrodes can be formed in one very thin, deposited layer of polycrystalline silicon, as a result of which the loss of light during image recording is reduced to a minimum. In addition, all gate electrodes are provided with a top layer of silicon nitride, causing light reflection to be counteracted. It has been found that such an image sensor without the above-described windows in the silicon nitride top layer present on the gate electrodes does not operate satisfactorily, which can be attributed to the fact that the above-mentioned diamond-shaped picture errors occur during image recording. Passivation of the above-mentioned surface states using hydrogen is not possible. It would be expected that hydrogen can penetrate through the silicon oxide edges of the gate electrodes and, via these electrodes and the diffusion windows, into the layer of silicon oxide of the gate dielectric. However, in practice this is not the case. In the customary manner of forming silicon oxide on the side faces of the very thin gate electrodes, whereby polycrystalline silicon is heated in water vapor, a layer having a very high silicon nitride content is formed below the silicon oxide. This is commonly referred to as the "white ribbon effect". The layer thus formed counteracts transport of hydrogen. Passivation is possible by means of the windows in the silicon nitride top layer present on the gate electrodes.

Optimum passivation using hydrogen is obtained if all gate electrodes extend, at the location where they cross channel stop regions, into diffusion windows formed there in the silicon nitride layer of the gate dielectric and, in particular, if windows are also formed in the silicon nitride top layer on all gate electrodes, which windows are in line with the diffusion windows in the layer of silicon nitride of the gate dielectric.

These and other aspects of the invention will be apparent from and elucidated with reference to the embodiment(s) described hereinafter.

DETAILED DESCRIPTION OF PREFERRED EMBODIMENTS

Figure 1:
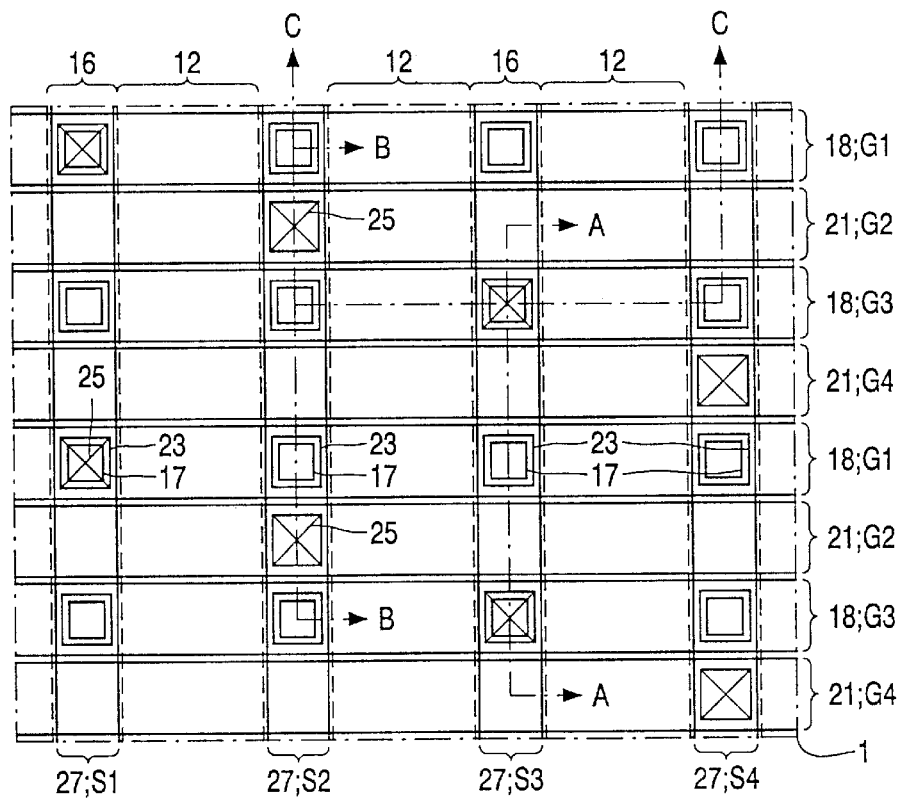
FIG. 1 is a diagrammatic plan view of a part of a first example of the image sensor in accordance with the invention, FIGS. 2 through 4 diagrammatically show a few cross-sectional views of the image sensor shown in FIG. 1, which cross-sectional views are taken on the lines, respectively, A—A, B—B and C—C.
Figure 2:
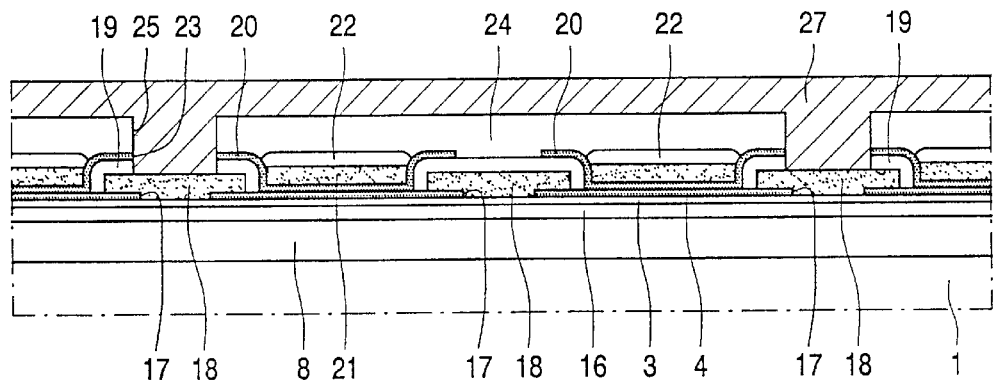
Figure 3:
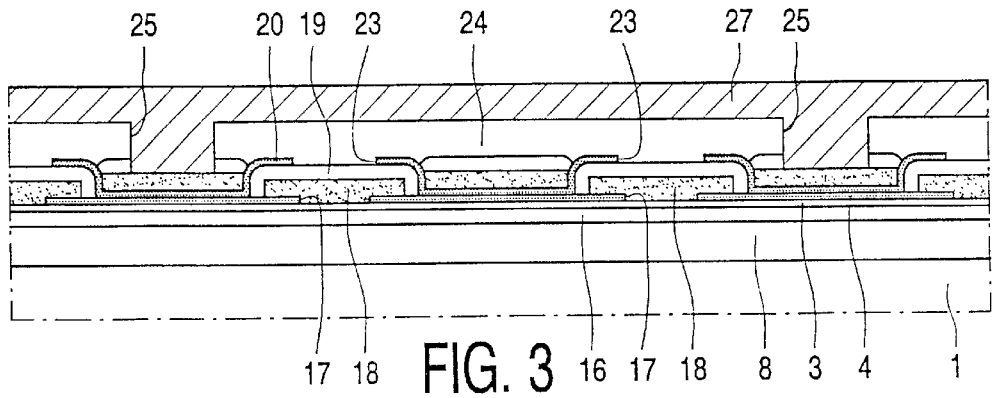
Figure 4:
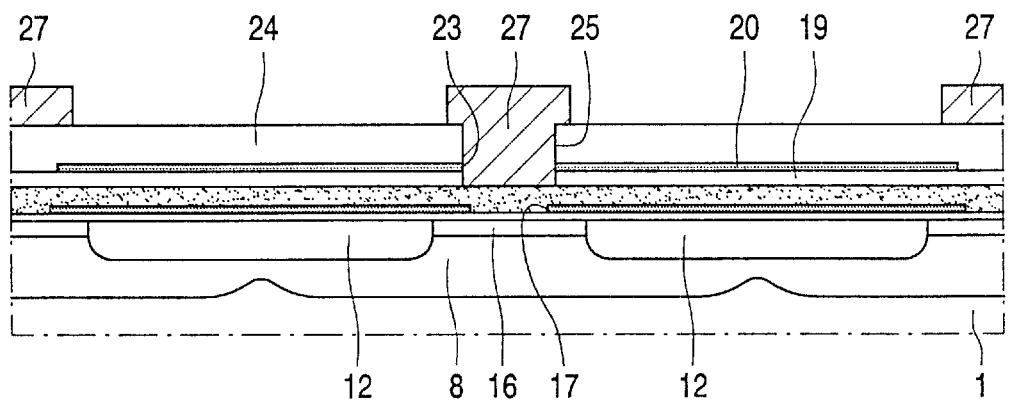

FIG. 1 is a diagrammatic plan view of a charge-coupled image sensor, and FIGS. 2 through 4 are cross-sectional views of a charge-coupled image sensor taken on the lines A—A, B—B and C—C, respectively, in FIG. 1, which charge-coupled image sensor comprises a silicon body 1 with a surface 2, parallel channel regions 12, formed in this body, and channel stop regions 16 mutually separating these channel regions being adjacent to said surface. Said surface 2 is provided with a gate dielectric 3, 4 which is composed of a layer of silicon oxide 3 covered with a silicon nitride layer 4. Gate electrodes 18, 21 of polycrystalline silicon extending transversely to the channel regions 12 and the channel stop regions 16 are formed on the gate dielectric 3,4. At least a number of the gate electrodes 18, 21, in this case the gate electrodes 18, are provided with a top layer of silicon nitride 20 and extend, at the location where they cross channel stop regions 16, into diffusion windows 17 which are formed there in the layer of silicon nitride 4 of the gate dielectric 3, 4. A layer of silicon oxide 19 also extends between the top layer 20 and the gate electrodes 18. In this example, the gate electrodes 21 are situated on the top layer of silicon nitride 20, and these gate electrodes 21 are also covered with a layer of silicon oxide 22.

All gate electrodes 18, 21 are provided with an insulation layer of silicon oxide 24 on which polycrystalline silicon shunt electrodes 27, situated above the channel stop regions 5, are formed which extend in a pattern of contact windows 25, 26 formed in the insulation layer, within which contact windows gate electrodes 18, 21 are exposed.

This image sensor, which can be used to record television images or digital photographs, comprises several million picture elements. Each picture element is formed by a part of a channel region 12 which is situated below four juxtaposed gate electrodes 18, 21. The gate electrodes, as shown in FIG. 1, are then clustered in groups of four juxtaposed electrodes G1, G2, G3 and G4. Outside the plane of the drawing, the gate electrodes G1 of these groups are interconnected, as are the gate electrodes G2, G3 and G4. During recording an image, the voltages applied to the gate electrodes are such that charge is stored in the picture elements. The charge packets thus collected are transported through the channel regions to a read-out register integrated on the silicon body by successively applying clock pulses to the gate electrodes.

The thin and narrow polycrystalline gate electrodes 18, 21 have a comparatively large length of several mm, as a result of which they exhibit a comparatively high electrical resistance. For this reason, shunt electrodes 27 of polycrystalline silicon are applied which extend transversely to the gate electrodes 18, 21. The shunt electrodes 27 contact the gate electrodes in accordance with a pattern. As shown in FIG. 1, said shunt electrodes are also clustered in groups of four juxtaposed electrodes S1, S2, S3 and S4. The shunt electrodes S1, S2, S3 and S4 are connected to, respectively, the gate electrodes G1, G2, G3 and G4. To reduce the resistance of the shunt electrodes, they may additionally be provided, in a customary manner, with a top layer, not shown, composed of a layer of titanium, a layer of titanium nitride and a layer of tungsten.

Figure 5:
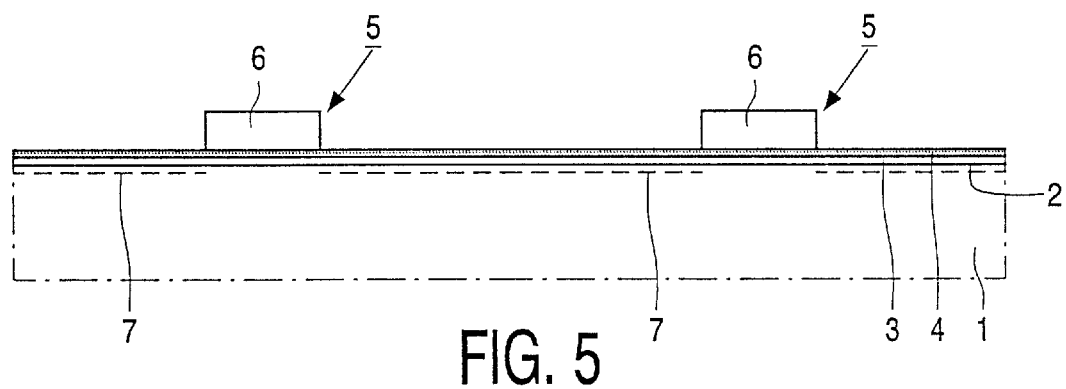
FIGS. 5 through 14 are diagrammatic, cross-sectional views of a few stages in the manufacture of the image sensor shown in FIG. 1, FIGS. 15 and 16 are diagrammatic, cross-sectional views of a few stages in the manufacture of a second embodiment of the image sensor in accordance with the invention.
Figure 6:
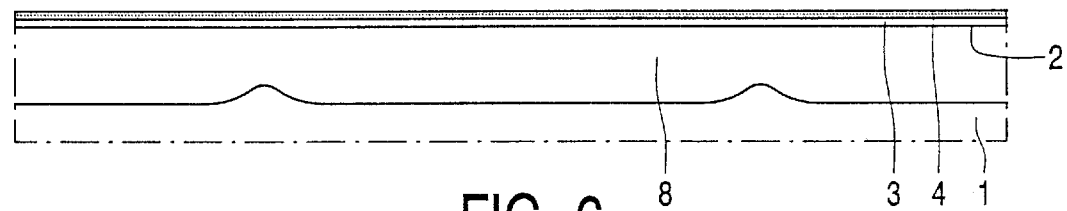

FIGS. 5 through 14 are diagrammatic, cross-sectional views of a few stages in the manufacture of a first example of the above-described image sensor. There is started from an n-type doped silicon body 1 having a surface 2. As shown in FIG. 5, first the gate dielectric 3, 4 is formed on the surface 2 of the silicon body 1. In a first step, an approximately 60 nm thick silicon oxide layer 3 is formed in a customary manner by thermal oxidation of the silicon surface 2. Subsequently, an approximately 75 nm thick layer of silicon nitride 4 is deposited thereon by means of a customary LPCVD (Low Pressure Chemical Vapor Deposition) process.

The next process steps, shown in FIGS. 5 through 9, refer to the cross-sectional views taken on the line C—C in FIG. 1.

After the gate dielectric 3, 4 has been formed, p-type doped zones, commonly referred to as p-wells, are formed so as to be adjacent to the surface 2. In practice, apart from the p-well, to be described hereinafter, for the actual sensor, also p-wells for electronics to be integrated in the sensor, such as a read-out register and signal amplifiers, are formed on the silicon body 1. To form the p-well for the actual sensor, a photoresist mask 5 is formed on the surface 2, as shown in FIG. 5, which photoresist mask includes strips of photoresist 6 extending transversely to the plane of the drawing. Subsequently, boron ions, indicated by means of dashed lines 7, are implanted. After the removal of the photoresist mask 5, a thermal treatment is carried out leading to the formation of the p-well 8 shown in FIG. 6. The implanted ions diffuse in the silicon body in such a manner that a p-well is formed which, at the location of channel regions 12 to be formed, has a smaller thickness than at the location of the channel stop regions 16 to be formed.

Figure 7:
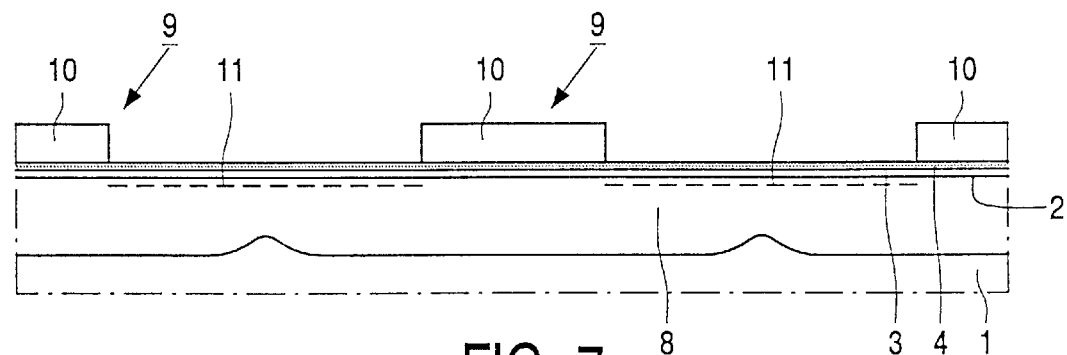
Figure 8:
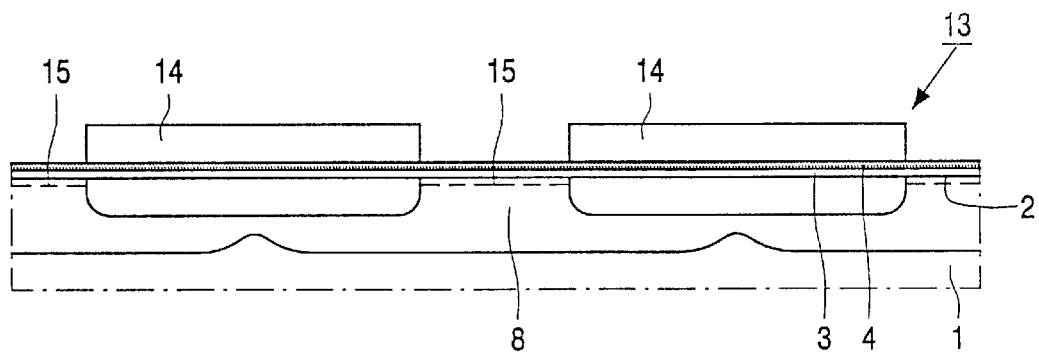
Figure 9:
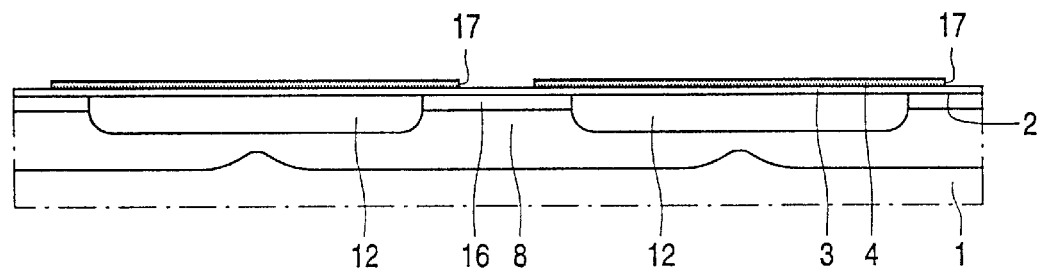

As shown in FIG. 7, after the formation of the p-well 8, a photoresist mask 9 having strips of photoresist 10 extending transversely to the plane of the drawing is formed on the gate dielectric 3,4. This photoresist mask 9 is used to define n-type channels to be formed in the p-well 8. After the formation of the photoresist mask 9, phosphor ions indicated by means of dashed lines 11 are implanted in the silicon body 1. After the removal of the photoresist mask 9, a thermal treatment is carried out wherein the approximately 2 µm wide, n-type channel regions 12, shown in FIG. 8, are formed. Centrally below these channels, the smaller thickness of the p-well 9 is visible.

After the formation of the n-type channels 12, a next photoresist mask 13 is formed on the gate dielectric 3, 4, as shown in FIG. 8, which photoresist mask comprises strips of photoresist 14 extending transversely to the plane of the drawing. The photoresist mask 14 is used to define, in the p-well 8, the channel stop regions which mutually separate the n-type channels 12. After the formation of the photoresist mask 13, boron ions, indicated by means of dashed lines 15, are implanted in the silicon body 1. After the removal of the photoresist mask, a thermal treatment is carried out, resulting in the formation of the approximately 1 µm wide, p-type channel stop regions 16, shown in FIG. 9.

For the following process steps, shown in FIGS. 10 through 14, reference is made to the cross-sectional views taken on the line A—A in FIG. 1.

After the formation of the semiconductor regions 8, 12 and 16, apertures 17, hereinafter referred to as diffusion windows, having a length and a width of approximately 0.5 µm, are etched in the silicon nitride layer 4 of the gate dielectric 3, 4. These diffusion windows 17 enable hydrogen to diffuse into the silicon oxide layer 3 of the gate dielectric 3, 4. These openings are situated at locations where the channel stop regions 16 and the gate electrodes 18 to be formed intersect. Subsequently, an approximately 140 nm thick polycrystalline silicon layer is deposited, which is provided with an n-type doping with a concentration of approximately $5.10^{19}$ atoms per cc by implantation of phosphor ions. Strips 18 extending transversely to the channel stop regions 16 are etched in a customary manner in this layer, said strips being provided with a layer of silicon oxide 19 by thermal oxidation. A first system of approximately 0.8 µm wide gate electrodes 18 provided with an insulating layer 19 is thus formed. The gate electrodes 18 extend into the diffusion windows 17 formed in the silicon nitride layer 4 of the gate dielectric 3, 4. The gate electrodes 18 have a thickness of approximately 60 nm, and the insulating layer 19 has a thickness of approximately 150 nm.

Subsequently, the whole is covered with an approximately 30 nm thick top layer 20 of silicon nitride. A second, approximately 140 nm thick layer of polycrystalline silicon is deposited thereon, which is provided, also by implantation of phosphor ions, with an n-type doping having a concentration of approximately $5.10^{19}$ atoms per cc. In this layer, a second system of approximately 0.8 µm wide and approximately 60 nm thick gate electrodes 21 provided with an approximately 50 nm thick layer of silicon oxide 22 is formed between the gate electrodes 18. These electrodes 21 are situated on the top layer of silicon nitride 20.

Figure 13:
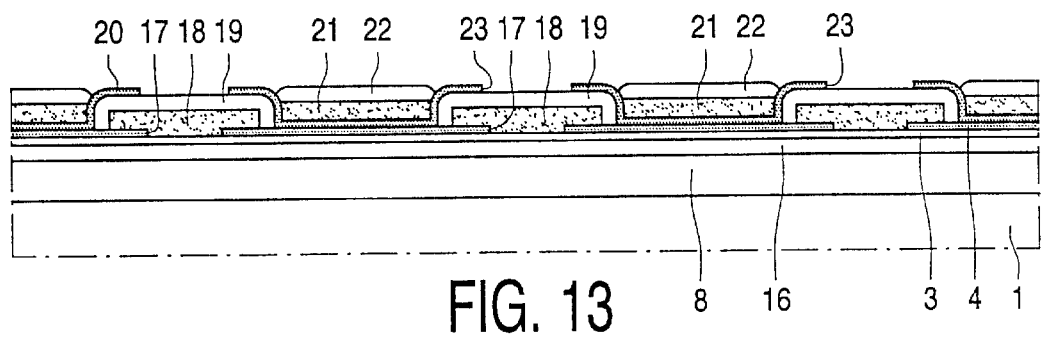
Figure 14:
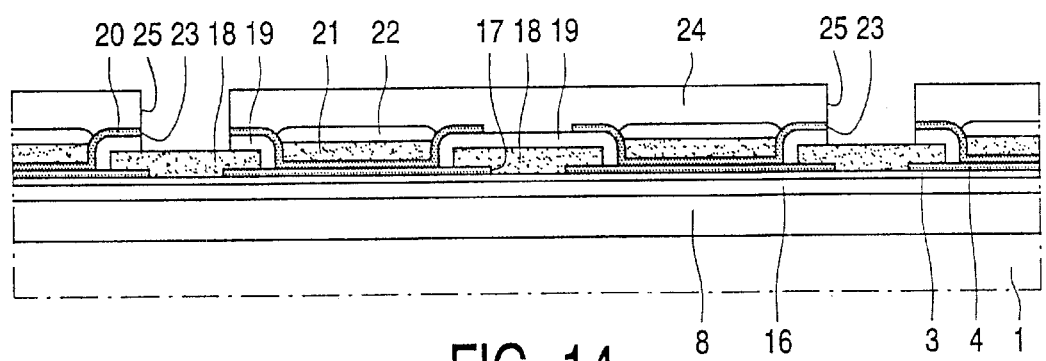

As shown in FIG. 13, windows 23 having a length and a width of approximately 0.5 µm are formed in the top layer 20 of silicon nitride 20. These windows are situated at the location where the channel stop regions 16 and the gate electrodes 18 intersect.

Subsequently, an approximately 500 nm thick layer of silicon oxide 24 is deposited on the gate electrodes 18 and 21 thus formed, contact windows 25 being formed in a customary manner in said silicon oxide layer, a number of said contact windows 25 on a number of the gate electrodes 18 being in line with the windows 23 formed in the top layer 20. This applies, in this case, to alternate gate electrodes 18. Subsequently, an approximately 500 nm thick polycrystalline layer is deposited on the silicon oxide layer 24 and in the contact windows 25, said polycrystalline layer being heavily n-type doped with approximately $10^{21}$ phosphor atoms per cc during the deposition process. In this layer a system of approximately 0.8 µm wide shunt electrodes 27 of polycrystalline silicon is formed in a customary manner as shown in FIGS. 2, 3 and 4. These shunt electrodes 26 extend above the channel stop regions 16 and contact, in accordance with a pattern, the gate electrodes 18 and 21, the gate electrodes 18 in the contact windows 25, and the gate electrodes 21 in the contact windows 26.

A number of the windows 23 formed in the silicon nitride top layer 20 present on a number of gate electrodes 18, which windows are in line with the diffusion windows 17 in the silicon nitride layer 4 of the gate dielectric 3, 4, form part of contact windows 25 wherein the polycrystalline silicon shunt electrodes 27 extend, while the other contact windows 25 are filled with the silicon oxide of the insulation layer 24. The windows 23 that form part of the contact windows 25 may be closed to hydrogen transport by silicon crystals of the polycrystalline silicon layer of the shunt electrodes 27. The other windows, which are filled with silicon oxide of the insulation layer of silicon oxide, will remain "open" to hydrogen. Hydrogen can reach the gate electrode 18 through the silicon oxide in these "open" windows, and the layer of silicon oxide 3 of the gate dielectric 3, 4 through the diffusion windows 17 present below the gate electrode. The "open" windows are provided above the channel stop regions 16 and hence between the actual picture elements. By virtue thereof, surface states near the interface between silicon of the channel regions 12 and the gate dielectric 3, 4 can be passivated by means of a thermal treatment in hydrogen. Otherwise, the use of the sensor may lead to diamond-shaped image errors. By providing comparatively small "open" windows, between the actual picture elements, in the top layer of silicon nitride 20, diamond-shaped image errors can be precluded without adversely affecting the light sensitivity of the image sensor.

The diffusion of hydrogen in the polycrystalline silicon occurs along the grain boundaries. In the comparatively thin, comparatively lightly doped gate electrodes 18, there are enough grain boundaries to enable diffusion of hydrogen through the windows 17 into the layer of silicon oxide 3 of the gate dielectric. During the formation of the comparatively thick and comparatively heavily doped shunt electrodes 27, large silicon crystals can be formed in the contact windows 25. In the contact windows 25 etched through the silicon nitride top layer of the first system of gate electrodes, said silicon crystals can close the opening 23 in the top layer of silicon nitride.

Figure 15:
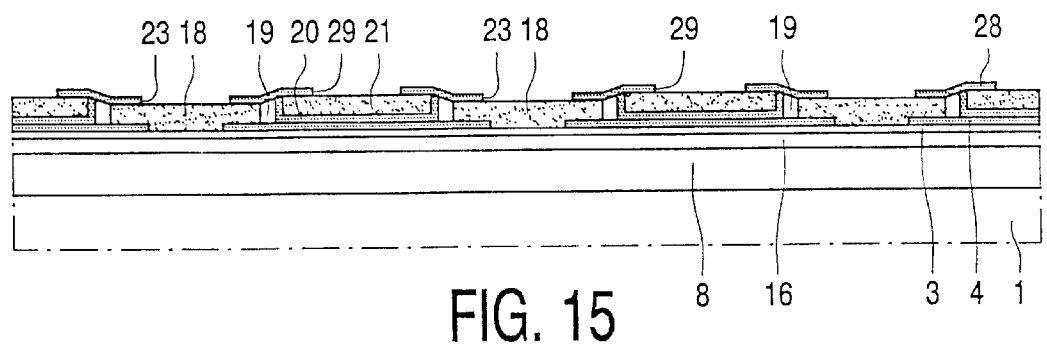
Figure 16:
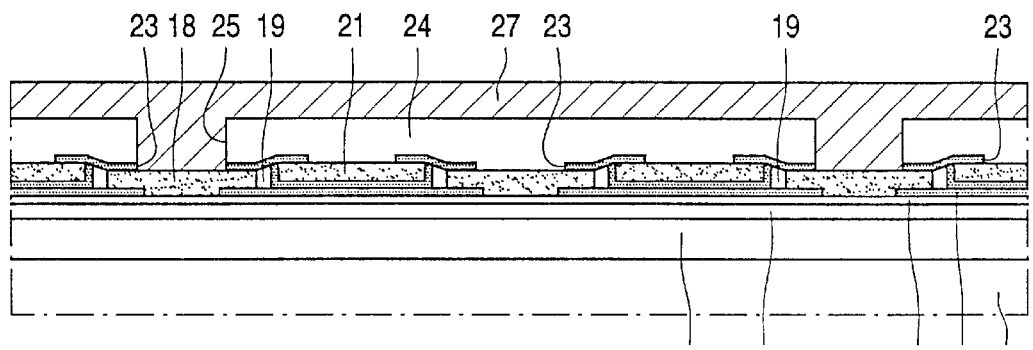
Figure 17:
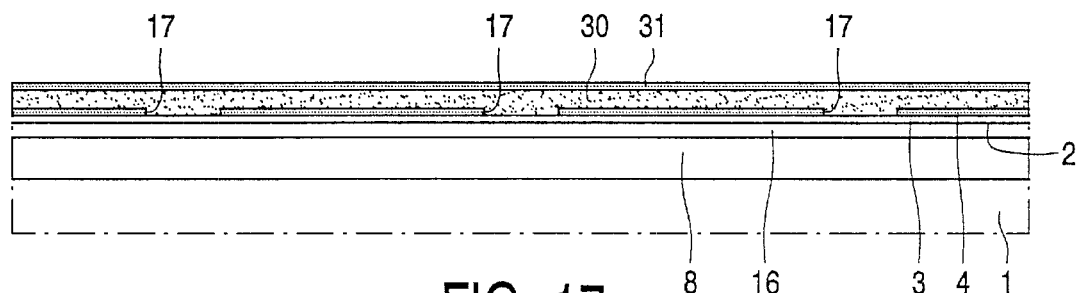
FIGS. 17 through 21 are diagrammatic, cross-sectional views of a few stages in the manufacture of a third embodiment of the image sensor in accordance with the invention.
Figure 18:
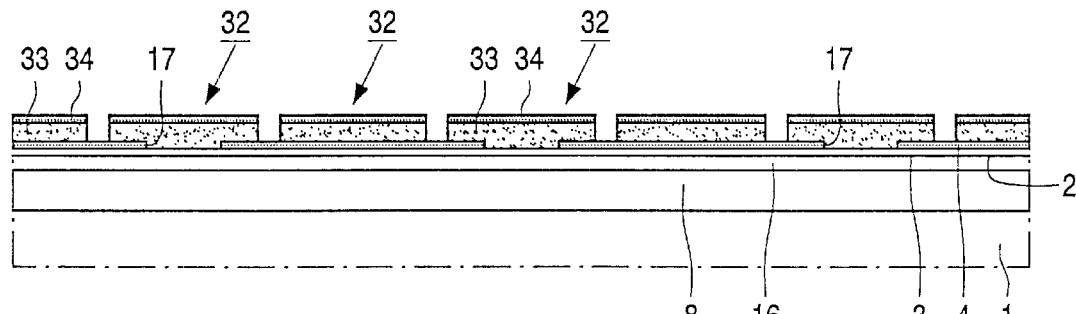
Figure 19:
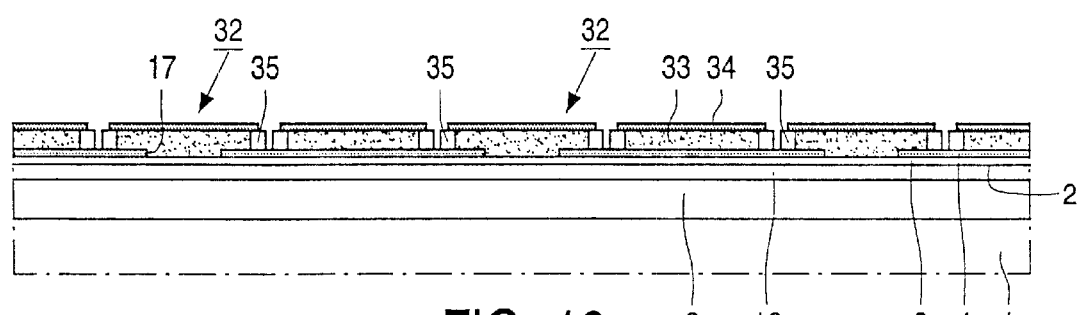
Figure 20:
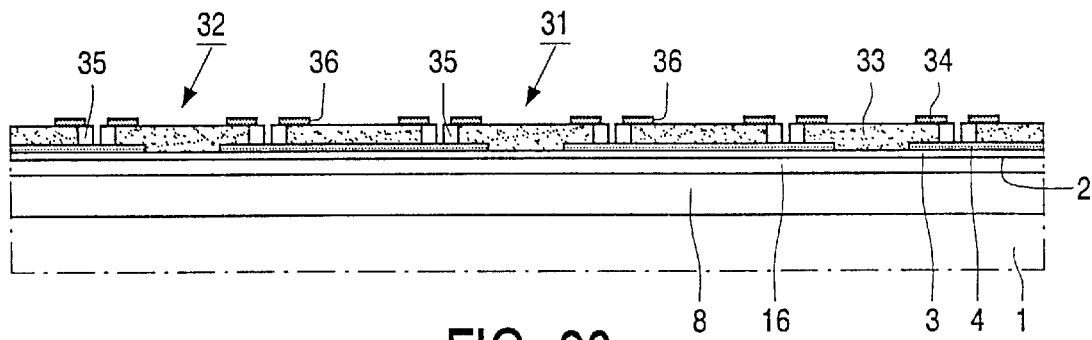

FIGS. 15 and 16 show a second embodiment of an image sensor, wherein all gate electrodes 18, 21 are provided with a top layer of silicon nitride 28. This results in a further increase of the light sensitivity. Apart from the gate electrodes 18 extending into said diffusion windows 17, also the gate electrodes 21 are provided with the silicon nitride top layer 28.

Figure 12:
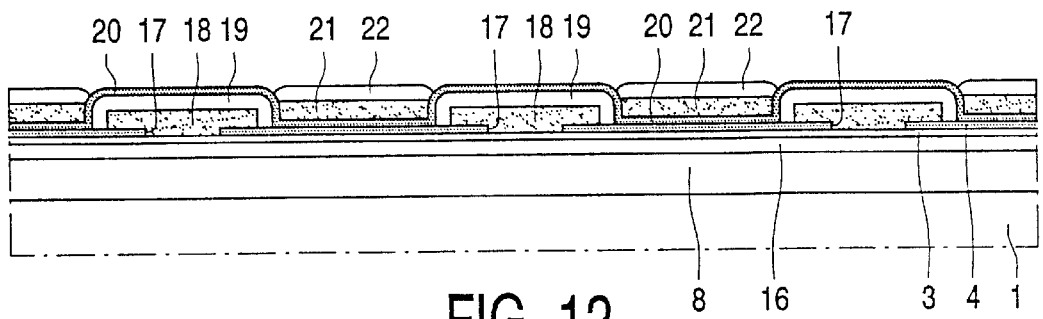

In the manufacture of this sensor, there is started from the situation as shown in FIG. 12. By means of etching, first the silicon nitride top layer 20 is removed from the silicon oxide layer 19 on the gate electrodes 18. Subsequently, the silicon oxide layer 19 is removed from the gate electrodes 18, and the silicon oxide layer 22 is removed from the gate electrodes 21. As shown in FIG. 15, a layer of silicon nitride 28 is deposited on the gate electrodes 18 and 21 thus exposed. In this layer, the windows 23 are formed above the gate electrodes 18. Subsequently, the insulating layer 24 and the shunt electrodes 27 can be formed on the structure thus formed. However, it is simpler, from a technological point of view, if in the silicon nitride top layer 28, apart from the windows 28, windows 29 are also formed on the other gate electrodes 21 at the locations where these gate electrodes cross channel stop regions 16. The windows 28 and 29 are formed before the silicon oxide insulation layer 24 is deposited. By virtue of this measure, all contact holes 25 and 26 to all gate electrodes 18 and 21 can be formed in one process step. The contact holes 25 and 26 can all be formed by etching in silicon oxide, so that etching in silicon oxide and silicon nitride to form a number of contact holes, and etching in silicon nitride to form still other contact holes is no longer necessary.

Figure 10:
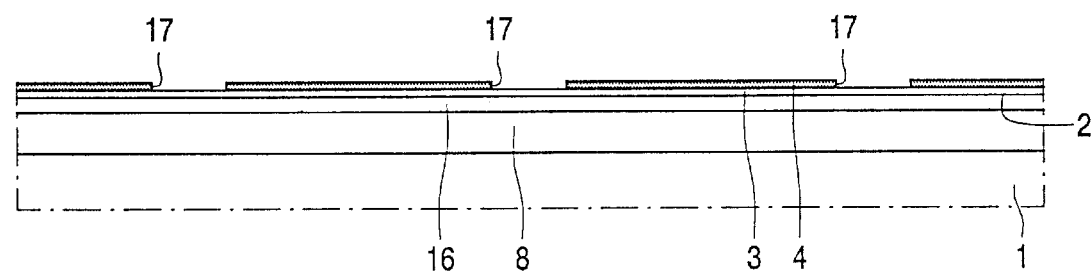
Figure 11:
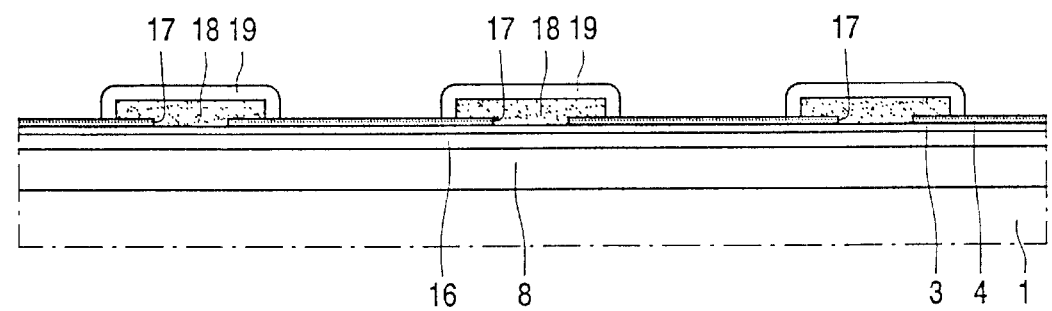

FIGS. 17 through 21 diagrammatically show, in cross-section, a few stages in the manufacturing process of a simple, very light-sensitive image sensor, the situation shown in FIG. 10 being taken as the starting point. An approximately 50 nm thick layer of polycrystalline silicon 30 is deposited on this structure, and this layer is subsequently covered with an approximately 40 nm thick layer of silicon nitride 31. Subsequently, gate electrodes 32 are formed in a customary manner in both layers 30, 31. The gate electrodes 32 of this sensor are thus formed by juxtaposed, equally thick strips of polycrystalline silicon 33, which are provided, on the upper side, with a top layer of silicon nitride 34. The side faces of the gate electrodes 32 are provided in a customary manner, i.e. by heating in water vapor, with a layer of silicon oxide 35, which is formed by thermal oxidation of polycrystalline silicon. The gate electrodes can be formed in a very thin, in this case 50 nm, deposited layer of polycrystalline silicon, thereby minimizing the loss of light during image recording. In addition, all gate electrodes 32 are provided with a top layer of silicon nitride 34, thereby counteracting light reflections.

As in the sensors described hereinabove, windows 36 are formed in the top layer 34, at the location where the gate electrodes 32 and the channel stop regions 16 intersect. Subsequently, the approximately 500 nm thick silicon oxide layer 24 is deposited, the contact windows 26 are etched and the shunt electrodes 27 are formed. Without the windows 36 in the silicon nitride top layer 34 on the gate electrodes 32, the sensor does not function properly, as a result of which the above-mentioned diamond-shaped image errors may occur during image recording. Passivation of the above-mentioned surface states using hydrogen is not possible. One would expect hydrogen to be capable of penetrating through the edges of silicon oxide 35 of the gate electrodes 32 and, via these electrodes and the diffusion windows 17, into the silicon oxide layer of the gate dielectric. However, it has been found that this is not the case. In the customary manner of forming silicon oxide on the side faces of the very thin gate electrodes by means of a thermal treatment in water vapor, a so-called "white ribbon" of silicon nitride is formed between the polycrystalline silicon of the electrodes 33 and the silicon oxide 35 below the silicon nitride layer 34 and above the silicon nitride layer 4. As the layer of polycrystalline silicon of the gate electrodes 33 is so thin, the side faces of the gate electrodes are closed to hydrogen. Passivation becomes possible by forming the windows 17 in the silicon nitride top layer 34 present on the gate electrodes 32.

Figure 21:
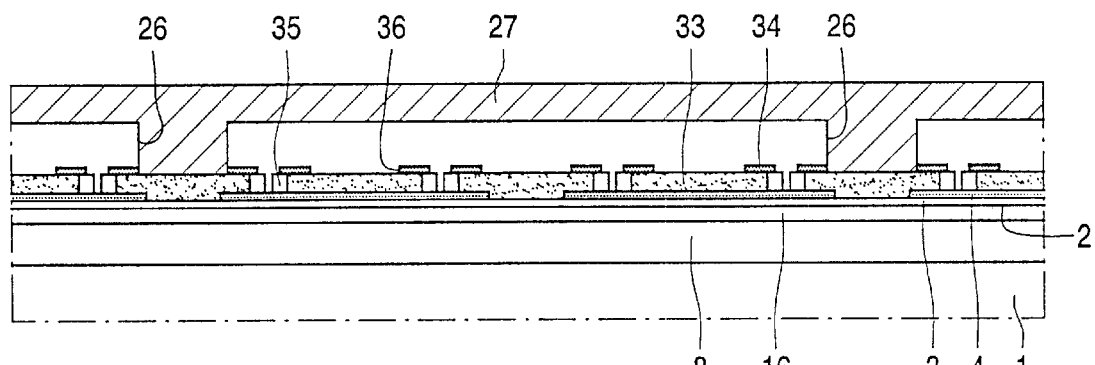
Figure 22:
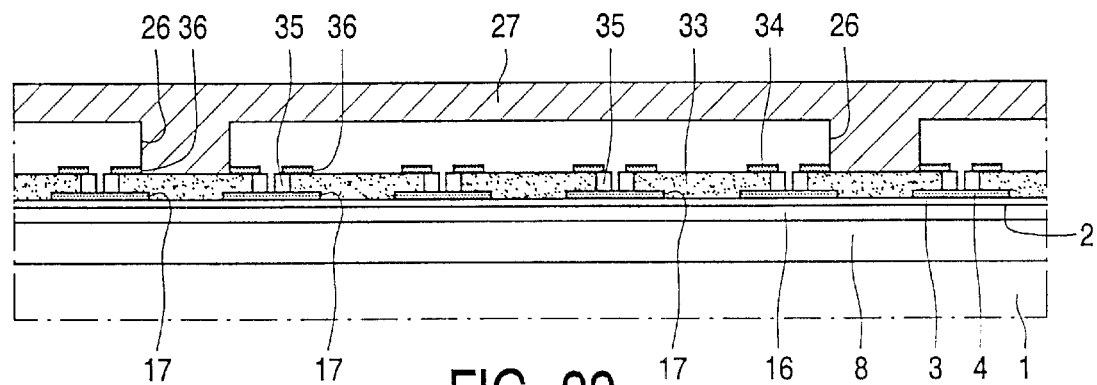
FIG. 22 is a diagrammatic, cross-sectional view of a fourth embodiment of the image sensor in accordance with the invention.

FIG. 22 is a diagrammatic, cross-sectional view of a modification of the sensor shown in FIG. 21. In this sensor, windows 17 are etched in the silicon nitride layer 4 of the gate dielectric 3, 4 at all locations where the gate electrodes 33 and the channel stop regions 16 intersect, and windows 36 are formed in the top layer of silicon nitride 34 on all gate electrodes 33, which windows are in line with the diffusion windows 17 in the silicon nitride layer 4 of the gate dielectric 3, 4. In this manner, optimum hydrogen passivation can be obtained.

What is claimed is:

1. A charge-coupled image sensor comprising a silicon body with a surface, parallel channel regions, formed in said body, and channel stop regions mutually separating these regions being adjacent to said surface, which surface is provided with a gate dielectric composed of a layer of silicon oxide covered with a layer of silicon nitride on which gate electrodes of polycrystalline silicon are formed so as to extend transversely to the channel regions and channel stop regions, at least a number of said gate electrodes being provided with a top layer of silicon nitride and extending into diffusion windows, at the location where said gate electrodes cross channel stop regions, which diffusion windows are formed in the layer of silicon nitride of the gate dielectric, an insulation layer of silicon oxide being provided on all gate electrodes, and, on top of said insulation layer, shunt electrodes of polycrystalline silicon situated above the channel stop regions being formed extending in a pattern of contact windows formed in the insulation layer, within which gate electrodes are exposed, characterized in that windows are formed in the silicon nitride top layer present on a number of gate electrodes, which windows are in line with the diffusion windows in the silicon nitride layer of the gate dielectric, a number of said windows forming part of contact windows wherein the shunt electrodes of polycrystalline silicon extend, while the other windows are filled with the silicon oxide of the insulation layer.

2. An image sensor as claimed in claim 1, characterized in that apart from the gate electrodes extending into said diffusion windows, other gate electrodes are present on the gate dielectric, which are also provided with a silicon nitride top layer.

3. An image sensor as claimed in claim 2, characterized in that, windows are also formed in the top layer of silicon nitride present on the other gate electrodes at the location where they cross channel stop regions.

4. An image sensor as claimed in claim 1, characterized in that the gate electrodes are formed by juxtaposed, equally thick strips of polycrystalline silicon which are provided, at the upper side, with a top layer of silicon nitride and, at the side faces, with a layer of silicon oxide formed by thermal oxidation of polycrystalline silicon.

5. An image sensor as claimed in claim 4, characterized in that all gate electrodes extend, at the location where they cross channel stop regions, into diffusion windows formed there in the silicon nitride layer of the gate dielectric.

6. An image sensor as claimed in claim 5, characterized in that windows are formed in the top layer of silicon nitride on all gate electrodes, which windows are in line with the diffusion windows in the layer of silicon nitride of the gate dielectric.

7. A charge-coupled image sensor comprising a silicon body with a surface, parallel channel regions, formed in said body, and channel stop regions mutually separating these regions being adjacent to said surface, which surface is provided with a gate dielectric composed of a layer of silicon oxide covered with a layer of silicon nitride on which gate electrodes of polycrystalline silicon are formed so as to extend transversely to the channel regions and channel stop regions, at least a number of said gate electrodes being provided with a top layer of silicon nitride and extending into diffusion windows, at the location where said gate electrodes cross channel stop regions, which diffusion windows are formed in the layer of silicon nitride of the gate dielectric, an insulation layer of silicon oxide being provided on all gate electrodes, and, on top of said insulation layer, shunt electrodes of polycrystalline silicon situated above the channel stop regions being formed extending in a pattern of contact windows formed in the insulation layer, within which gate electrodes are exposed, characterized in that windows are formed in the silicon nitride top layer present on a number of gate electrodes, which windows are in line with the diffusion windows in the silicon nitride layer of the gate dielectric, a number of said windows forming part of contact windows wherein the shunt electrodes of polycrystalline silicon extend, while the other windows are filled with the silicon oxide of the insulation layer and in that apart from the gate electrodes extending into said diffusion windows, other gate electrodes are present on the gate dielectric, which are also provided with a silicon nitride top layer.

8. An image sensor as claimed in claim 1, characterized in that, windows are also formed in the top layer of silicon nitride present on the other gate electrodes at the location where they cross channel stop regions.

9. An image sensor as claimed in claim 1, characterized in that the gate electrodes are formed by juxtaposed, equally thick strips of polycrystalline silicon which are provided, at the upper side, with a top layer of silicon nitride and, at the side faces, with a layer of silicon oxide formed by thermal oxidation of polycrystalline silicon.

10. An image sensor as claimed in claim 3, characterized in that all gate electrodes extend, at the location where they cross channel stop regions, into diffusion windows formed there in the silicon nitride layer of the gate dielectric.

11. An image sensor as claimed in claim 4, characterized in that windows are formed in the top layer of silicon nitride on all gate electrodes, which windows are in line with the diffusion windows in the layer of silicon nitride of the gate dielectric.

12. A charge coupled device formed in a substrate that has a silicon surface, the charge coupled device comprising:

a plurality of channels formed in the substrate between adjacent channel stops;

a first plurality of polycrystalline silicon conductors disposed transversely to the channels and spaced apart from the silicon surface, the first plurality of polycrystalline silicon conductors including first and second polycrystalline silicon conductors, a first plane being defined to contain the first plurality of polycrystalline silicon conductors;

a first silicon oxide film formed between first plane and the silicon surface;

a first silicon nitride film formed between the first silicon oxide film and the first plane, the first silicon nitride film having first and second apertures therein, the first aperture being disposed over the first polycrystalline silicon conductor where the first polycrystalline silicon conductor crosses a first channel stop, the second aperture being disposed over the second polycrystalline silicon conductor where the second polycrystalline silicon conductor crosses the first channel stop;

a second silicon nitride film formed over the first plurality of polycrystalline silicon conductors, the second silicon nitride film having first and second apertures therein, the first aperture being disposed over the first aperture in the first silicon nitride film, the second aperture being disposed over the second aperture in the first silicon nitride film;

a second silicon oxide film being disposed over the second silicon nitride film and filling the second aperture in the second silicon nitride film, the second silicon oxide film having a first aperture disposed over the first aperture in the second silicon nitride film; and a shunt conductor of polycrystalline silicon extending parallel with and spaced apart from the first channel stop, the shunt conductor including a contact part extending through the first aperture in the second silicon oxide film and extending through the first aperture in the second silicon nitride film and making contact with the first polycrystalline silicon conductor.

* * * * *